(12) United States Patent
Terasaki

(10) Patent No.: US 12,002,732 B2
(45) Date of Patent: Jun. 4, 2024

(54) COPPER/CERAMIC ASSEMBLY, INSULATED CIRCUIT BOARD, METHOD FOR PRODUCING COPPER/CERAMIC ASSEMBLY, AND METHOD FOR PRODUCING INSULATED CIRCUIT BOARD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 372 days.

(21) Appl. No.: 17/615,213

(22) PCT Filed: Jun. 23, 2020

(86) PCT No.: PCT/JP2020/024500
§ 371 (c)(1),
(2) Date: Nov. 30, 2021

(87) PCT Pub. No.: WO2021/033421
PCT Pub. Date: Feb. 25, 2021

(65) Prior Publication Data
US 2022/0230935 A1 Jul. 21, 2022

(30) Foreign Application Priority Data

Aug. 21, 2019 (JP) .................................. 2019-151166

(51) Int. Cl.
*H01L 23/373* (2006.01)
*H01L 21/48* (2006.01)
*H01L 23/00* (2006.01)

(52) U.S. Cl.
CPC ...... *H01L 23/3735* (2013.01); *H01L 21/4857* (2013.01); *H01L 21/4871* (2013.01);
(Continued)

(58) Field of Classification Search
None
See application file for complete search history.

(56) References Cited

U.S. PATENT DOCUMENTS

2015/0313011 A1* 10/2015 Terasaki ............. B23K 35/3006
228/122.1
2020/0006213 A1* 1/2020 Terasaki ................ C04B 37/023

FOREIGN PATENT DOCUMENTS

JP 3211856 B2 9/2001
JP 4375730 B2 12/2009
(Continued)

OTHER PUBLICATIONS

International Search Report dated Aug. 18, 2020, issued for PCT/JP2020/024500 and English translation thereof.

*Primary Examiner* — Timothy J Thompson
*Assistant Examiner* — John B Freal
(74) *Attorney, Agent, or Firm* — Locke Lord LLP

(57) ABSTRACT

This A copper/ceramic bonded body includes: a copper member made of copper or a copper alloy; and a ceramic member made of oxygen-containing ceramics, wherein the copper member and the ceramic member are bonded to each other, a magnesium oxide layer is formed on a ceramic member side between the copper member and the ceramic member, and an active metal oxide phase composed of an oxide of one or more active metals selected from Ti, Zr, Nb, and Hf is dispersed inside a copper layer in contact with the magnesium oxide layer.

20 Claims, 3 Drawing Sheets

(52) U.S. Cl.
CPC .......... *H01L 23/3733* (2013.01); *H01L 24/29* (2013.01); *H01L 24/32* (2013.01); *H01L 2224/29109* (2013.01); *H01L 2224/29111* (2013.01); *H01L 2224/29139* (2013.01); *H01L 2224/29147* (2013.01); *H01L 2224/32225* (2013.01)

(56) References Cited

FOREIGN PATENT DOCUMENTS

| | | | |
|---|---|---|---|
| JP | 2014-116353 A | 6/2014 | |
| JP | 2015-177045 A | 10/2015 | |
| JP | 2018-140929 A | 9/2018 | |
| JP | 2019-127432 A | 8/2019 | |

\* cited by examiner

COPPER/CERAMIC ASSEMBLY, INSULATED CIRCUIT BOARD, METHOD FOR PRODUCING COPPER/CERAMIC ASSEMBLY, AND METHOD FOR PRODUCING INSULATED CIRCUIT BOARD

TECHNICAL FIELD

The present invention relates to a copper/ceramic bonded body in which a copper member made of copper or a copper alloy and a ceramic member are bonded to each other, an insulating circuit substrate in which a copper sheet made of copper or a copper alloy is bonded to a surface of a ceramic substrate, a method for producing a copper/ceramic bonded body, and a method for producing an insulating circuit substrate.

The present application claims priority on Japanese Patent Application No. 2019-151166 filed on Aug. 21, 2019, the content of which is incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer made of a conductive material is formed on one surface of an insulating layer.

For example, a power semiconductor element for high-power control used for controlling a wind power generation, an electric vehicle, a hybrid vehicle, or the like has a large amount of heat generated during operation. Therefore, as a substrate on which the power semiconductor element is mounted, an insulating circuit substrate including a ceramic substrate and a circuit layer formed by bonding a metal sheet having excellent conductivity to one surface of the ceramic substrate has been widely used in the related art. As the insulating circuit substrate, one including a metal layer formed by bonding a metal sheet to the other surface of the ceramic substrate is also provided.

For example, Patent Document 1 proposes an insulating circuit substrate in which a circuit layer and a metal layer are formed by bonding a copper sheet to each of one surface and the other surface of a ceramic substrate. In Patent Document 1, the copper sheet is disposed on each of one surface and the other surface of the ceramic substrate with an Ag—Cu—Ti-based brazing material interposed therebetween, and the copper sheet is bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheet are satisfactorily bonded to each other.

Patent Document 2 proposes an insulating circuit substrate in which a ceramic substrate and a copper sheet are bonded to each other by using a Cu—Mg—Ti-based brazing material.

In Patent Document 2, the bonding is performed by heating at a temperature of 560° C. to 800° C. in a nitrogen gas atmosphere, and Mg in a Cu—Mg—Ti alloy is sublimated and Mg does not remain at a bonded interface, while titanium nitride (TiN) is not substantially formed.

PRIOR ART DOCUMENTS

Patent Document

Patent Document 1: Japanese Patent No. 3211856
Patent Document 2: Japanese Patent No. 4375730

DISCLOSURE OF INVENTION

Problems to be Solved by the Invention

By the way, in a high-temperature semiconductor device using SiC or the like, since semiconductor elements may be mounted at a high density, it is necessary to ensure operation at a higher temperature in the insulating circuit substrate. Therefore, it is required to ensure the bonding reliability between the copper sheet and the ceramic substrate even when a thermal cycle that is more severe than in the related art is applied.

Further, in the circuit layer of the above-described insulating circuit substrate, a terminal material or the like may be subjected to ultrasonic welding.

In the insulating circuit substrates disclosed in Patent Documents 1 and 2, when ultrasonic waves are applied to bond the terminal material or the like, cracks are generated at the bonded interface, and there is a concern that the circuit layer may be peeled.

The present invention has been made in view of the above-described circumstances, and an object of the present invention is to provide a copper/ceramic bonded body, an insulating circuit substrate, a method for producing a copper/ceramic bonded body, and a method for producing an insulating circuit substrate, which can ensure the bonding reliability between a copper member and a ceramic member even when a severe thermal cycle is applied, and can suppress peeling of copper member from the ceramic member even when ultrasonic welding is performed.

Solutions for Solving the Problems

In order to solve the above-described problem, a copper/ceramic bonded body according to one aspect of the present invention (hereinafter, referred to as a "copper/ceramic bonded body according to the present invention") includes a copper member made of copper or a copper alloy, and a ceramic member made of oxygen-containing ceramics, in which the copper member and the ceramic member are bonded to each other, a magnesium oxide layer is formed on a ceramic member side between the copper member and the ceramic member, and an active metal oxide phase composed of an oxide of one or more active metals selected from Ti, Zr, Nb, and Hf is dispersed inside a copper layer in contact with the magnesium oxide layer.

According to the copper/ceramic bonded body according to the present invention, the magnesium oxide layer is formed between the copper member and the ceramic member. Therefore, a thermal stress caused by a difference in thermal expansion coefficient between the copper member and the ceramic member can be reduced by the magnesium oxide layer, and the bonding reliability after thermal cycle is applied can be improved.

Since the active metal oxide phase composed of the oxide of one or more active metals selected from Ti, Zr, Nb, and Hf is dispersed inside the copper layer in contact with the magnesium oxide layer, a bonded interface is strengthened, and thus, even when ultrasonic waves are applied to the bonded body for ultrasonic welding of a terminal material or the like, peeling of the copper member from the ceramic member and generation of cracks in a ceramic substrate can be suppressed.

In the copper/ceramic bonded body according to the present invention, it is preferable that a thickness of the magnesium oxide layer is set to be in a range of 50 nm or more and 1000 nm or less.

In this case, since the thickness of the magnesium oxide layer that is formed between the copper member and the ceramic member is set to be in the range of 50 nm or more and 1000 nm or less, the thermal stress caused by the difference in thermal expansion coefficient between the copper member and the ceramic member can be sufficiently reduced by the magnesium oxide layer, and the bonding reliability after thermal cycle is applied can be further improved.

In addition, in the copper/ceramic bonded body according to the present invention, it is preferable that either one or both of Cu particles and compound particles of Cu and an active metal are dispersed inside the magnesium oxide layer.

In this case, the strength of the magnesium oxide layer formed at the bonded interface is improved by the above-described Cu particles and compound particles, and thus peeling of the copper member from the ceramic member and generation of cracks in a ceramic substrate can be further suppressed when ultrasonic waves are applied.

Further, in the copper/ceramic bonded body according to the present invention, it is preferable that an equivalent circle diameter of the Cu particles and the compound particles dispersed inside the magnesium oxide layer is set to be in a range of 10 nm or more and 100 nm or less.

In this case, since the equivalent circle diameter of the Cu particles and the compound particles is set to be in the range of 10 nm or more and 100 nm or less, the strength of the magnesium oxide layer formed at the bonded interface is reliably improved, and thus peeling of the copper member from the ceramic member and generation of cracks in a ceramic substrate can be further suppressed when ultrasonic waves are applied.

In addition, in the copper/ceramic bonded body according to the present invention, it is preferable that the active metal is Ti.

In this case, a titanium oxide phase is dispersed inside the copper layer in contact with the magnesium oxide layer, so that the bonded interface can be reliably strengthened, and even when ultrasonic waves are applied, peeling of the copper member from the ceramic member and generation of cracks in a ceramic substrate can be further suppressed.

An insulating circuit substrate according to another aspect of the present invention (hereinafter, referred to as an "insulating circuit substrate according to the present invention") includes a copper sheet made of copper or a copper alloy, and a ceramic substrate made of oxygen-containing ceramics, in which the copper sheet is bonded to a surface of the ceramic substrate, a magnesium oxide layer is formed on a ceramic substrate side between the ceramic substrate and the copper sheet, and an active metal oxide phase composed of an oxide of one or more active metals selected from Ti, Zr, Nb, and Hf is dispersed inside a copper layer in contact with the magnesium oxide layer.

According to the insulating circuit substrate according to the present invention, the magnesium oxide layer is formed between the copper sheet and the ceramic substrate. Therefore, a thermal stress caused by a difference in thermal expansion coefficient between the copper sheet and the ceramic substrate can be reduced by the magnesium oxide layer, and the bonding reliability after thermal cycle is applied can be improved.

Since the active metal oxide phase composed of the oxide of one or more active metals selected from Ti, Zr, Nb, and Hf is dispersed inside the copper layer in contact with the magnesium oxide layer, a bonded interface is strengthened, and thus, even when ultrasonic waves are applied, peeling of the copper sheet from the ceramic substrate and generation of cracks in the ceramic substrate can be suppressed.

In the insulating circuit substrate according to the present invention, it is preferable that a thickness of the magnesium oxide layer is set to be in a range of 50 nm or more and 1000 nm or less.

In this case, since the thickness of the magnesium oxide layer that is formed between the copper sheet and the ceramic substrate is set to be in the range of 50 nm or more and 1000 nm or less, the thermal stress caused by the difference in thermal expansion coefficient between the copper sheet and the ceramic substrate can be sufficiently reduced by the magnesium oxide layer, and the bonding reliability after thermal cycle is applied can be further improved.

In addition, in the insulating circuit substrate according to the present invention, it is preferable that either one or both of Cu particles and compound particles of Cu and an active metal are dispersed inside the magnesium oxide layer.

In this case, the strength of the magnesium oxide layer formed at the bonded interface is improved by the above-described Cu particles and compound particles, and thus peeling of the copper sheet from the ceramic substrate and generation of cracks in the ceramic substrate can be further suppressed when ultrasonic waves are applied.

Further, in the insulating circuit substrate according to the present invention, it is preferable that an equivalent circle diameter of the Cu particles and the compound particles dispersed inside the magnesium oxide layer is set to be in a range of 10 nm or more and 100 nm or less.

In this case, since the equivalent circle diameter of the Cu particles and the compound particles is set to be in the range of 10 nm or more and 100 nm or less, the strength of the magnesium oxide layer formed at the bonded interface is reliably improved, and thus peeling of the copper sheet from the ceramic substrate and generation of cracks in the ceramic substrate can be further suppressed when ultrasonic waves are applied.

In addition, in the insulating circuit substrate according to the present invention, it is preferable that the active metal is Ti.

In this case, a titanium oxide phase is dispersed inside the copper layer in contact with the magnesium oxide layer, so that the bonded interface can be reliably strengthened, and even when ultrasonic waves are applied, peeling of the copper sheet from the ceramic substrate and generation of cracks in the ceramic substrate can be further suppressed.

A method for producing a copper/ceramic bonded body according to still another aspect of the present invention (hereinafter, referred to as a "method for producing a copper/ceramic bonded body according to the present invention") is a method for producing the copper/ceramic bonded body described above, the method includes an active metal and Mg disposing step of disposing Mg and one or more active metals selected from Ti, Zr, Nb, and Hf between the copper member and the ceramic member, a laminating step of laminating the copper member and the ceramic member with the active metal and Mg interposed therebetween, and a bonding step of performing a heating treatment on the laminated copper member and ceramic member with the active metal and Mg interposed therebetween in a state of being pressed in a lamination direction under a vacuum atmosphere to bond the copper member and the ceramic member to each other, in which, in the active metal and Mg disposing step, an amount of the active metal is set to be in a range of 0.4 µmol/cm$^2$ or more and 47.0 µmol/cm$^2$ or less, and an amount of Mg is set to be in a range of 14 µmol/cm$^2$ or more and 180 µmol/cm$^2$ or less, and in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

According to the method for producing a copper/ceramic bonded body having the configuration, in the active metal and Mg disposing step, the amount of the active metal is set to be in the range of 0.4 µmol/cm$^2$ or more and 47.0 µmol/cm$^2$ or less, and the amount of Mg is set to be in the range of 14 µmol/cm$^2$ or more and 180 µmol/cm$^2$ or less. Therefore, a sufficient liquid phase required for an interfacial reaction can be obtained. Accordingly, the copper member and the ceramic member can be reliably bonded to each other.

In the bonding step, the temperature increase rate in the temperature range of 480° C. or higher and lower than 650° C. is set to be 5° C./min or higher, the holding temperature is set to be in the range of 650° C. or higher and 850° C. or lower, and the holding time at the holding temperature is set to be in the range of 10 minutes or longer and 180 minutes or shorter. Therefore, the liquid phase required for the interfacial reaction can be held for a certain period of time or longer, a uniform interfacial reaction is promoted, the magnesium oxide layer is formed at the bonded interface, and the active metal oxide phase composed of the oxide of one or more active metals selected from Ti, Zr, Nb, and Hf is dispersed inside the copper layer in contact with the magnesium oxide layer.

A method for producing an insulating circuit substrate according to still another aspect of the present invention is a method for producing the insulating circuit substrate described above, the method includes an active metal and Mg disposing step of disposing Mg and one or more active metals selected from Ti, Zr, Nb, and Hf between the copper sheet and the ceramic substrate, a laminating step of laminating the copper sheet and the ceramic substrate with the active metal and Mg interposed therebetween, and a bonding step of performing a heating treatment on the laminated copper sheet and ceramic substrate with the active metal and Mg interposed therebetween in a state of being pressed in a lamination direction under a vacuum atmosphere to bond the copper sheet and the ceramic substrate to each other, in which, in the active metal and Mg disposing step, an amount of the active metal is set to be in a range of 0.4 µmol/cm$^2$ or more and 47.0 µmol/cm$^2$ or less, and an amount of Mg is set to be in a range of 14 µmol/cm$^2$ or more and 180 µmol/cm$^2$ or less, and in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

According to the method for producing an insulating circuit substrate having the configuration, in the active metal and Mg disposing step, the amount of the active metal is set to be in the range of 0.4 µmol/cm$^2$ or more and 47.0 µmol/cm$^2$ or less, and the amount of Mg is set to be in the range of 14 µmol/cm$^2$ or more and 180 mol/cm$^2$ or less. Therefore, a sufficient liquid phase required for an interfacial reaction can be obtained. Accordingly, the copper sheet and the ceramic substrate can be reliably bonded to each other.

In the bonding step, the temperature increase rate in the temperature range of 480° C. or higher and lower than 650° C. is set to be 5° C./min or higher, the holding temperature is set to be in the range of 650° C. or higher and 850° C. or lower, and the holding time at the holding temperature is set to be in the range of 10 minutes or longer and 180 minutes or shorter. Therefore, the liquid phase required for the interfacial reaction can be held for a certain period of time or longer, a uniform interfacial reaction is promoted, the magnesium oxide layer is formed at the bonded interface, and the active metal oxide phase composed of the oxide of one or more active metals selected from Ti, Zr, Nb, and Hf is dispersed inside the copper layer in contact with the magnesium oxide layer.

Effects of Invention

According to the present invention, it is possible to provide a copper/ceramic bonded body, an insulating circuit substrate, a method for producing a copper/ceramic bonded body, and a method for producing an insulating circuit substrate, which can ensure the bonding reliability between a copper member and a ceramic member even when a severe thermal cycle is applied, and can suppress peeling of the copper member from the ceramic member and generation of cracks in a ceramic substrate even when ultrasonic welding is performed.

EMBODIMENTS FOR CARRYING OUT THE INVENTION

Hereinafter, an embodiment of the present invention will be described with reference to the accompanying drawings.

Figure 1:
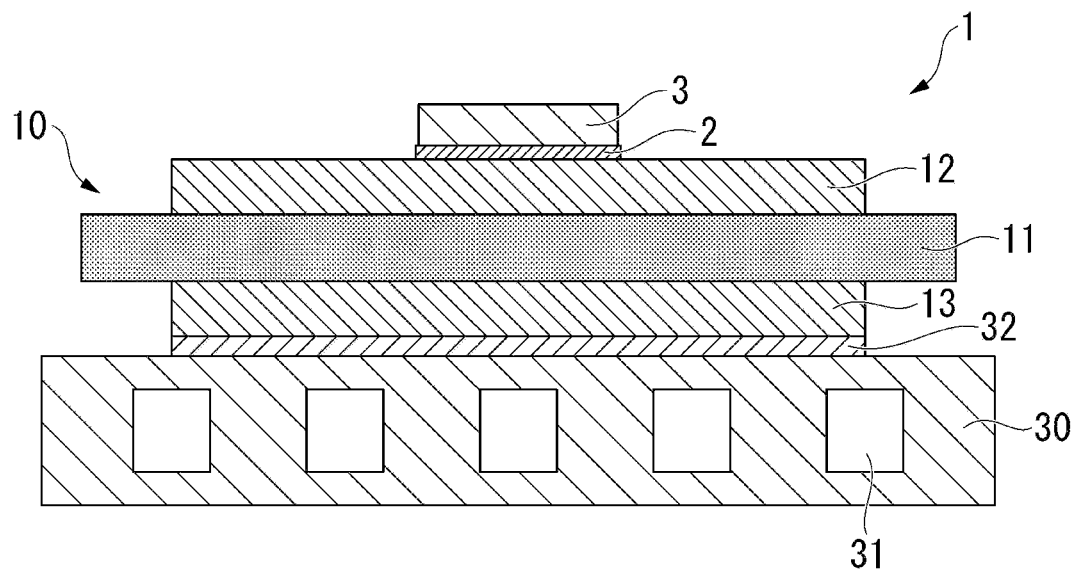
FIG. 1 is a schematic explanatory view of a power module using an insulating circuit substrate according to an embodiment of the present invention.

A bonded body to the present embodiment is an insulating circuit substrate 10 formed by bonding a copper sheet 22 (circuit layer 12) and a copper sheet 23 (metal layer 13) as copper members made of copper or a copper alloy to a ceramic substrate 11 as a ceramic member made of ceramics. FIG. 1 shows a power module 1 including an insulating circuit substrate 10 according to the present embodiment.

The power module 1 includes the insulating circuit substrate 10 on which the circuit layer 12 and the metal layer 13 are disposed, a semiconductor element 3 bonded to one surface (upper surface in FIG. 1) of the circuit layer 12 with a bonding layer 2 interposed therebetween, and a heat sink 30 disposed on the other side (lower side in FIG. 1) of the metal layer 13.

The semiconductor element 3 is made of a semiconductor material such as Si. The semiconductor element 3 and the circuit layer 12 are bonded to each other with the bonding layer 2 interposed therebetween.

The bonding layer 2 is made of, for example, a Sn—Ag-based, Sn—In-based, or Sn—Ag—Cu-based solder material.

The heat sink 30 dissipates heat from the above-mentioned insulating circuit substrate 10. The heat sink 30 is made of Cu or a Cu alloy, and in the present embodiment, the heat sink 30 is made of phosphorus deoxidized copper. The heat sink 30 is provided with a passage 31 through which a cooling fluid flows.

In the present embodiment, the heat sink 30 and the metal layer 13 are bonded to each other by a solder layer 32 made of a solder material. The solder layer 32 is made of, for example, a Sn—Ag-based, Sn—In-based, or Sn—Ag—Cu-based solder material.

As shown in FIG. 1, the insulating circuit substrate 10 of the present embodiment includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is made of oxygen-containing ceramics having excellent insulating properties and heat radiation, and in the present embodiment, the ceramic substrate 11 is made of aluminum oxide ($Al_2O_3$). The thickness of the ceramic substrate 11 is set to be in a range of, for example, 0.2 mm or more and 1.5 mm or less, and in the present embodiment, the thickness is set to 0.635 mm.

Figure 4:
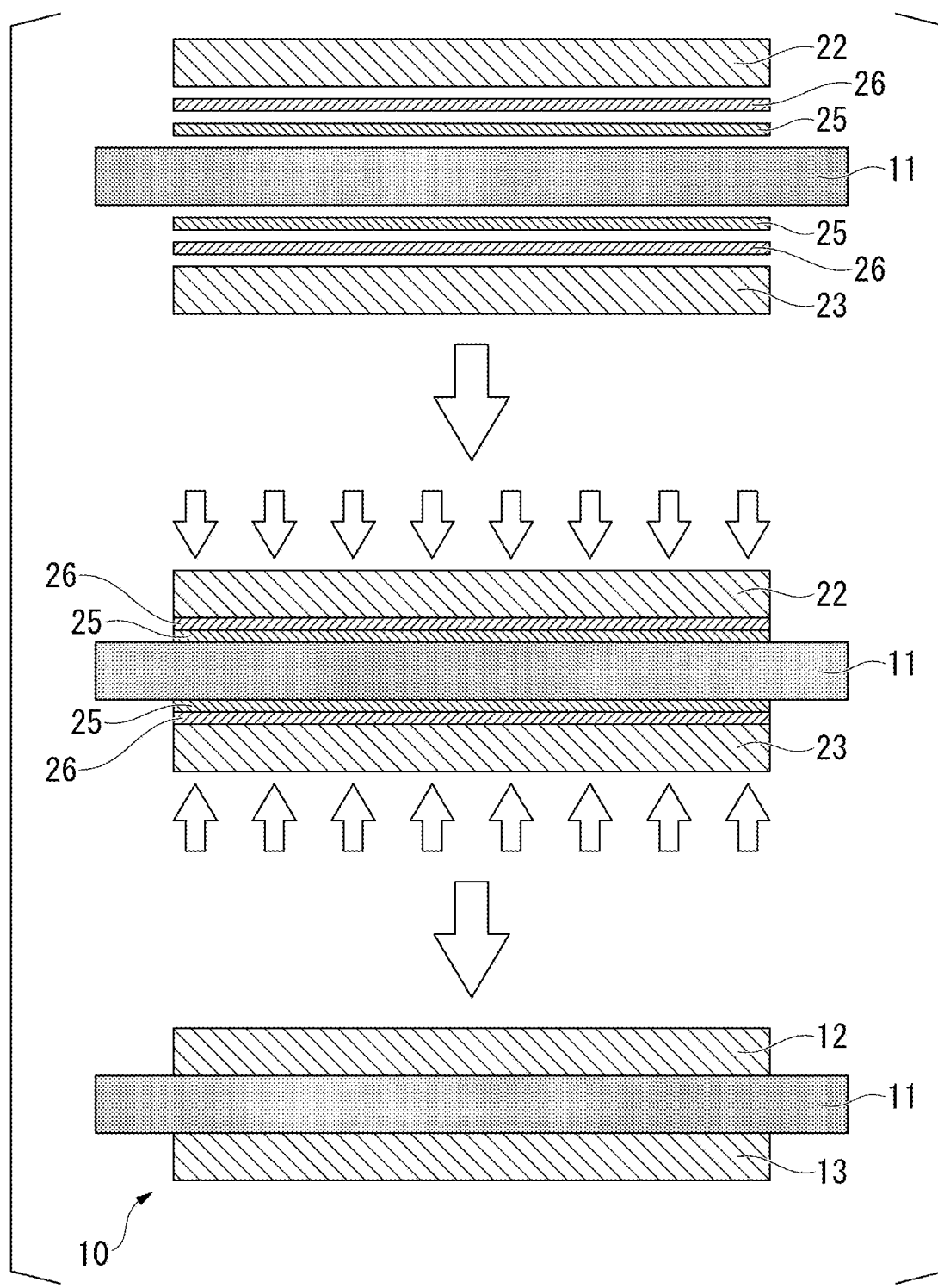
FIG. 4 is a schematic explanatory view of the method for producing the insulating circuit substrate according to the embodiment of the present invention.

As shown in FIG. 4, the circuit layer 12 is formed by bonding the copper sheet 22 made of copper or a copper alloy to one surface (upper surface in FIG. 4) of the ceramic substrate 11.

In the present embodiment, the circuit layer 12 is formed by bonding the copper sheet 22 made of a rolled sheet of oxygen-free copper to the ceramic substrate 11.

The thickness of the copper sheet 22 serving as the circuit layer 12 is set to be in a range of 0.1 mm or more and 2.0 mm or less, and in the present embodiment, the thickness is set to 0.6 mm.

As shown in FIG. 4, the metal layer 13 is formed by bonding the copper sheet 23 made of copper or a copper alloy to the other surface (lower surface in FIG. 4) of the ceramic substrate 11.

In the present embodiment, the metal layer 13 is formed by bonding the copper sheet 23 made of a rolled sheet of oxygen-free copper to the ceramic substrate 11.

The thickness of the copper sheet 23 serving as the metal layer 13 is set to be in a range of 0.1 mm or more and 2.0 mm or less, and in the present embodiment, the thickness is set to 0.6 mm.

Figure 2:
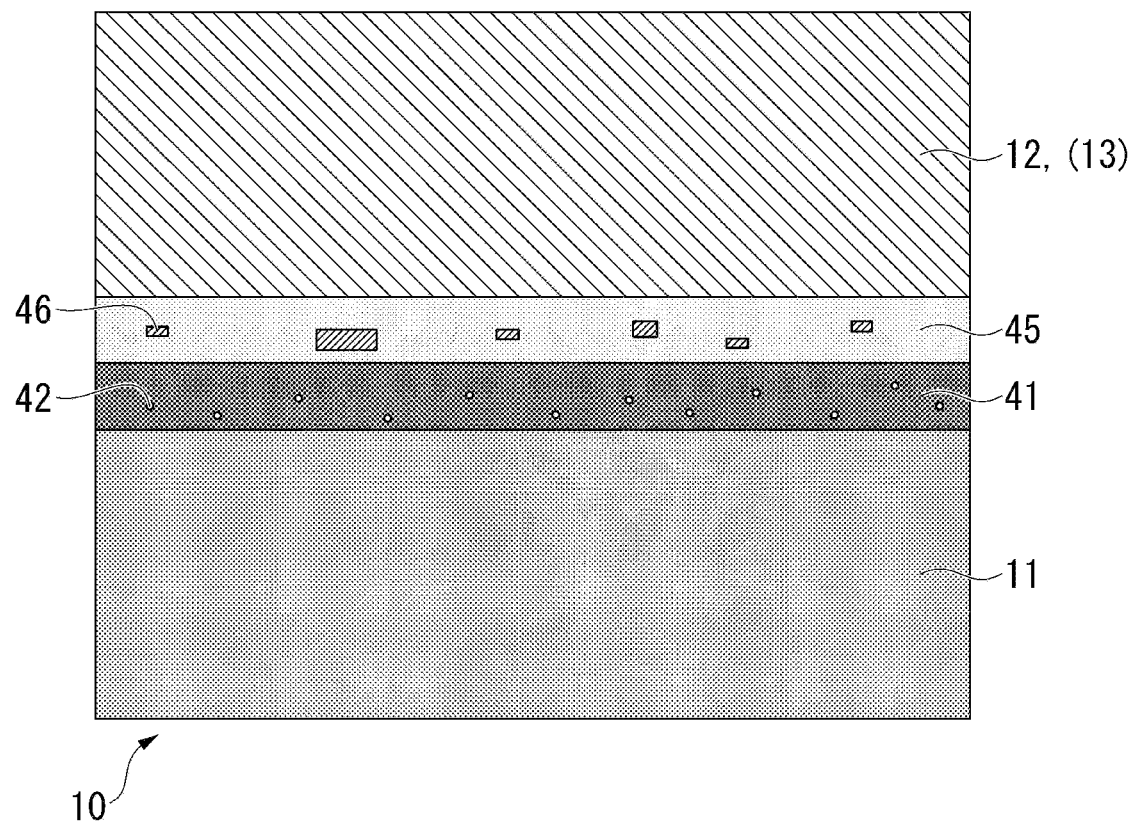
FIG. 2 is an enlarged explanatory view of a bonded interface between a circuit layer (metal layer) and a ceramic substrate of the insulating circuit substrate according to the embodiment of the present invention.

At a bonded interface between the ceramic substrate 11 and the circuit layer 12 (metal layer 13), as shown in FIG. 2, a magnesium oxide layer 41 is formed on the ceramic substrate 11 side, and a copper layer 45 is formed so as to be laminated on the magnesium oxide layer 41.

The magnesium oxide layer 41 is a layer provided directly on the ceramic substrate 11. A main component of the magnesium oxide layer 41 is magnesium oxide.

The copper layer 45 is a layer present between the magnesium oxide layer 41 and the circuit layer 12 (metal layer 13). A main component of the copper layer 45 is copper or a copper alloy, and an active metal oxide phase 46 composed of an oxide of one or more active metals selected from Ti, Zr, Nb, and Hf is dispersed inside the copper layer 45. In the present embodiment, it is preferable to use Ti as the active metal.

In the present embodiment, it is preferable that the thickness of the magnesium oxide layer 41 is set to be in a range of 50 nm or more and 1000 nm or less.

The lower limit of the thickness of the magnesium oxide layer 41 is preferably 80 nm or more, and more preferably 150 nm or more. On the other hand, the upper limit of the thickness of the magnesium oxide layer 41 is preferably 700 nm or less, and more preferably 500 nm or less.

The lower limit of the thickness of the copper layer 45 is preferably 0.1 μm or more, and more preferably 5 μm or more. On the other hand, the upper limit of the thickness of the copper layer 45 is preferably 80 μm or less, and more preferably 60 μm or less.

In the present embodiment, it is preferable that Cu-containing particles 42 composed of either one or both of Cu particles and compound particles of Cu and an active metal are dispersed inside the magnesium oxide layer 41.

The Cu particles are a phase composed of Cu present inside the magnesium oxide layer 41. The compound particles of Cu and the active metal are a phase composed of Cu and the active metal (one or more selected from Ti, Zr, Nb, and Hf) present inside the magnesium oxide layer 41.

Examples of the compound particles of Cu and the active metal include $Cu_4Ti$, $Cu_3Ti_2$, $Cu_4Ti_3$, $CuTi$, $CuTi_2$, $CuTi_3$, $Cu_5Zr$, $Cu_{51}Zr_{14}$, $Cu_8Zr_3$, $Cu_{10}Zr_7$, $CuZr$, $Cu_5Zr_8$, $CuZr_2$, $Cu_{51}Hf_{14}$, $Cu_8Hf_3$, $Cu_{10}Hf_7$, and $CuHf_2$. Further, in the present embodiment, it is preferable that the equivalent circle diameter of the Cu-containing particles 42 dispersed inside the magnesium oxide layer 41 is set to be in a range of 10 nm or more and 100 nm or less.

The lower limit of the equivalent circle diameter of the Cu-containing particles 42 dispersed inside the magnesium oxide layer 41 is more preferably 15 nm or more, and still more preferably 20 nm or more. On the other hand, the upper limit of the equivalent circle diameter of the Cu-containing particles 42 is more preferably 70 nm or less, and still more preferably 50 nm or less.

Figure 3:
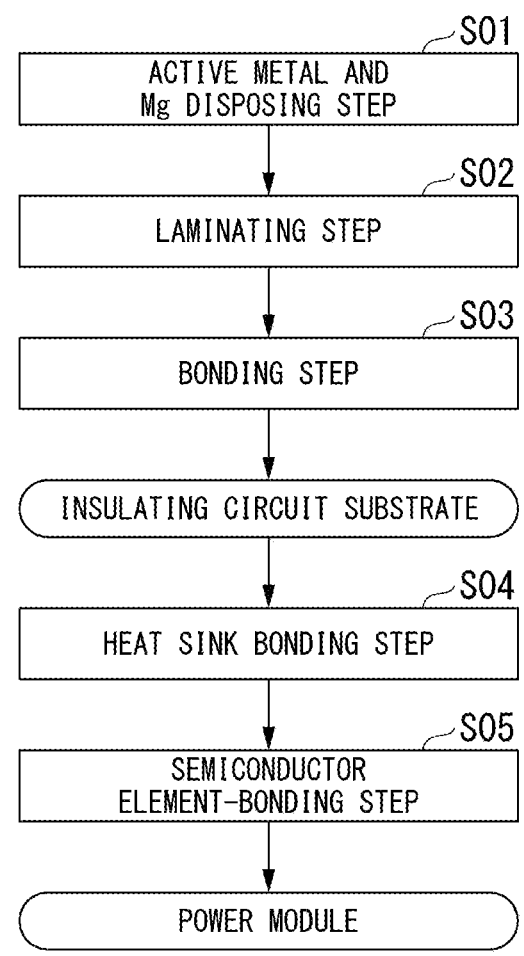
FIG. 3 is a flowchart of a method for producing the insulating circuit substrate according to the embodiment of the present invention.

Hereinafter, a method for producing the insulating circuit substrate 10 according to the present embodiment will be described with reference to FIGS. 3 and 4.

(Active Metal and Mg Disposing Step S01)

First, the ceramic substrate 11 made of aluminum oxide ($Al_2O_3$) is prepared, and as shown in FIG. 4, Mg and one or more active metals selected from Ti, Zr, Nb, and Hf are disposed between the copper sheet 22 serving as the circuit layer 12 and the ceramic substrate 11, and between the copper sheet 23 serving as the metal layer 13 and the ceramic substrate 11.

In the present embodiment, a Mg foil 25 and an active metal foil 26 are disposed between the copper sheet 22 serving as the circuit layer 12 and the ceramic substrate 11, and between the copper sheet 23 serving as the metal layer 13 and the ceramic substrate 11.

In an active metal and Mg disposing step S01, the amount of the active metal to be disposed is set to be in a range of 0.4 μmol/cm$^2$ or more and 47.0 μmol/cm$^2$ or less, and an amount of Mg is set to be in a range of 14 mol/cm$^2$ or more and 180 μmol/cm$^2$ or less.

The lower limit of the amount of the active metal to be disposed is preferably 0.9 μmol/cm$^2$ or more, and more preferably 2.8 μmol/cm$^2$ or more. On the other hand, the upper limit of the amount of the active metal to be disposed is preferably 20 μmol/cm² or less, and more preferably 10 mol/cm² or less.

In addition, the lower limit of the amount of Mg to be disposed is preferably 21 mol/cm² or more, and more preferably 28 μmol/cm² or more. On the other hand, the upper limit of the amount of the Mg to be disposed is preferably 107 μmol/cm² or less, and more preferably 72 μmol/cm² or less.

(Laminating Step S02)

Next, the copper sheet 22 and the ceramic substrate 11 are laminated with the active metal foil 26 and the Mg foil 25 interposed therebetween, and the ceramic substrate 11 and the copper sheet 23 are laminated with the active metal foil 26 and the Mg foil 25 interposed therebetween.

(Bonding Step S03)

Next, the copper sheet 22, the active metal foil 26, the Mg foil 25, the ceramic substrate 11, the Mg foil 25, the active metal foil 26, and the copper sheet 23 which are laminated are pressed in a lamination direction, and are loaded into a vacuum furnace and heated such that the copper sheet 22, the ceramic substrate 11, and the copper sheet 23 are bonded together.

Heating treatment conditions in a bonding step S03 are such that a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter. By defining the heating treatment conditions in this way, the Cu—Mg liquid phase can be maintained at the bonded interface in a high temperature state, the magnesium oxide layer 41 and the copper layer 45 are formed at the bonded interface, and the active metal oxide phase 46 composed of an oxide of one or more active metals selected from Ti, Zr, Nb, and Hf is dispersed inside the copper layer 45.

The lower limit of the temperature increase rate in the temperature range of 480° C. or higher and lower than 650° C. is preferably 7° C./min or higher, and more preferably 9° C./min or higher. On the other hand, the upper limit of the temperature increase rate in the temperature range of 480° C. or higher and lower than 650° C. is not particularly limited, but is preferably 15° C./min or lower, and more preferably 12° C./min or lower.

In addition, the lower limit of the holding temperature is preferably 700° C. or higher, and more preferably 750° C. or higher. In addition, the upper limit of the holding temperature is preferably 830° C. or lower, and more preferably 800° C. or lower.

Further, the lower limit of the holding time is preferably 30 minutes or longer, and more preferably 45 minutes or longer. On the other hand, the upper limit of the holding time is preferably 150 minutes or shorter, and more preferably 120 minutes or shorter.

A pressing load in the bonding step S03 is preferably in a range of 0.049 MPa or more and 3.4 MPa or less.

Further, a degree of vacuum in the bonding step S03 is preferably in a range of $1\times10^{-6}$ Pa or more and $5\times10^{-2}$ Pa or less.

As described above, the insulating circuit substrate 10 according to the present embodiment is produced by the active metal and Mg disposing step S01, the laminating step S02, and the bonding step S03.

(Heat Sink Bonding Step S04)

Next, the heat sink 30 is bonded to the other surface side of the metal layer 13 of the insulating circuit substrate 10. The insulating circuit substrate 10 and the heat sink 30 are laminated with a solder material interposed therebetween and are loaded into a heating furnace such that the insulating circuit substrate 10 and the heat sink 30 are solder-bonded to each other with the solder layer 32 interposed therebetween.

(Semiconductor Element-Bonding Step S05)

Next, the semiconductor element 3 is bonded to one surface of the circuit layer 12 of the insulating circuit substrate 10 by soldering.

The power module 1 shown in FIG. 1 is produced by the above steps.

According to the insulating circuit substrate 10 (copper/ceramic bonded body) of the present embodiment having the above-described configuration, since the magnesium oxide layer 41 is formed between the circuit layer 12 and the metal layer 13 and the ceramic substrate 11, a thermal stress caused by a difference in thermal expansion coefficient between the circuit layer 12 and the metal layer 13 and the ceramic substrate 11 can be reduced by the magnesium oxide layer 41, and the bonding reliability after thermal cycle is applied can be improved.

Since the active metal oxide phase 46 composed of an oxide of one or more active metals selected from Ti, Zr, Nb, and Hf is dispersed inside the copper layer 45 in contact with the magnesium oxide layer 41, the bonded interface is strengthened. Therefore, even when ultrasonic waves are applied to the insulating circuit substrate 10 (copper/ceramic bonded body) for ultrasonic welding to bond the terminal material or the like to the copper member (circuit layer 12), peeling of the circuit layer 12 and the metal layer 13 from the ceramic substrate 11 and generation of cracks in the ceramic substrate 11 can be suppressed.

In the present embodiment, since the thickness of the magnesium oxide layer 41 is set to be in a range of 50 nm or more and 1000 nm or less, the thermal stress caused by the difference in thermal expansion coefficient between the circuit layer 12 and the metal layer 13 and the ceramic substrate 11 can be sufficiently reduced by the magnesium oxide layer 41, and the bonding reliability after thermal cycle is applied can be further improved.

Further, in the present embodiment, when the Cu-containing particles 42 composed of either one or both of Cu particles and compound particles of Cu and an active metal are dispersed inside the magnesium oxide layer 41, the Cu-containing particles 42 improve the strength of the magnesium oxide layer 41 formed at the bonded interface, and thus peeling of the circuit layer 12 and the metal layer 13 from the ceramic substrate 11 and generation of cracks in the ceramic substrate 11 can be further suppressed when ultrasonic waves are applied.

In the present embodiment, when the equivalent circle diameter of the Cu-containing particles 42 dispersed inside the magnesium oxide layer 41 is set to be in a range of 10 nm or more and 100 nm or less, the strength of the magnesium oxide layer 41 formed at the bonded interface is reliably improved, and thus peeling of the circuit layer 12 and the metal layer 13 from the ceramic substrate 11 and generation of cracks in the ceramic substrate 11 can be further suppressed when ultrasonic waves are applied.

In the present embodiment, when the active metal is Ti, a titanium oxide phase is dispersed inside the copper layer 45 in contact with the magnesium oxide layer 41 as the active metal oxide phase 46, so that the bonded interface can be reliably strengthened, and even when ultrasonic waves are applied, peeling of the circuit layer 12 and the metal layer 13 from the ceramic substrate 11 and generation of cracks in the ceramic substrate 11 can be further suppressed.

According to the method for producing the insulating circuit substrate according to the present embodiment, in the active metal and Mg disposing step S01, since the amount of the active metal is set to be in a range of 0.4 μmol/cm$^2$ or more and 47.0 μmol/cm$^2$ or less, and the amount of Mg is set to be in a range of 14 mol/cm$^2$ or more and 180 μmol/cm$^2$ or less, a sufficient liquid phase required for an interfacial reaction can be obtained. Therefore, the circuit layer 12 and the metal layer 13 can be reliably bonded to the ceramic substrate 11.

In the bonding step S03, the temperature increase rate in the temperature range of 480° C. or higher and lower than 650° C. is set to be 5° C./min or higher, the holding temperature is set to be in a range of 650° C. or higher and 850° C. or lower, and the holding time at the holding temperature is set to be in a range of 10 minutes or longer and 180 minutes or shorter. Therefore, the liquid phase required for the interfacial reaction can be held for a certain period of time or longer, a uniform interfacial reaction is promoted, the magnesium oxide layer 41 is formed at the bonded interface, and the active metal oxide phase 46 composed of the oxide of one or more active metals selected from Ti, Zr, Nb, and Hf is dispersed inside the copper layer 45 in contact with the magnesium oxide layer 41.

The embodiment of the present invention has been described, but the present invention is not limited thereto, and can be appropriately changed without departing from the technical features of the present invention.

For example, in the present embodiment, the semiconductor element is mounted on the insulating circuit substrate to form the power module, but the present embodiment is not limited thereto. For example, an LED element may be mounted on the circuit layer of the insulating circuit substrate to form an LED module, or a thermoelectric element may be mounted on the circuit layer of the insulating circuit substrate to form a thermoelectric module.

In the insulating circuit substrate of the present embodiment, it has been described that both of the circuit layer and the metal layer are made of copper sheets made of copper or a copper alloy, but the present invention is not limited thereto.

For example, in a case where the circuit layer and the ceramic substrate are made of the copper/ceramic bonded body according to the present invention, there is no limitation on the material and the bonding method of the metal layer. There may be no metal layer, the metal layer may be made of aluminum or an aluminum alloy, or may be made of a laminate of copper and aluminum.

On the other hand, in a case where the metal layer and the ceramic substrate are made of the copper/ceramic bonded body according to the present invention, there is no limitation on the material and the bonding method of the circuit layer. The circuit layer may be made of aluminum or an aluminum alloy, or may be made of a laminate of copper and aluminum.

Further, in the present embodiment, the configuration has been described in which the active metal foil and the Mg foil are laminated between the copper sheet and the ceramic substrate, but the present invention is not limited thereto, and an alloy foil of Mg and the active metal may be disposed. In addition, a thin film made of Mg, the active metal, an alloy of Mg and the active metal, or the like may be formed on the bonding surface between the ceramic substrate and the copper sheet by a sputtering method, a vapor deposition method, or the like.

A required amount of a paste containing the corresponding active metal may be applied instead of the active metal foil.

Similarly, a required amount of a paste containing Mg may be applied instead of the Mg foil.

Only one of the active metal foil and the Mg foil may be replaced with a paste. Both the active metal foil and the Mg foil may be replaced with a paste. A paste containing an alloy of Mg and the active metal may be used.

As a filler contained in these pastes, $MgH_2$ and an active metal hydrogenated compound may be used.

EXAMPLES

Hereinafter, results of confirmation experiments performed to confirm the effects of the present invention will be described.

First, a ceramic substrate (40 mm×40 mm×0.635 mm) made of aluminum oxide ($Al_2O_3$) was prepared.

A copper sheet (37 mm×37 mm×thickness of 0.3 mm) made of oxygen-free copper was bonded to both surfaces of the ceramic substrate under the conditions shown in Table 1 to obtain an insulating circuit substrate (copper/ceramic bonded body). A degree of vacuum of a vacuum furnace at the time of bonding was set to 8×10$^{-3}$ Pa.

The obtained insulating circuit substrate (copper/ceramic bonded body) was evaluated for the thickness of a magnesium oxide layer at a bonded interface, the presence or absence and the equivalent circle diameter of Cu-containing particles (either one or both of Cu particles and compound particles of Cu and an active metal) in the magnesium oxide layer, the presence or absence of an active metal oxide phase in a copper layer, and the ultrasonic welding as follows.

(Magnesium Oxide Layer)

The bonded interface between the copper sheet and the ceramic substrate was observed in a range of 3 μm×3 μm at an acceleration voltage of 200 kV and a magnification of 20,000 by using a transmission electron microscope (Titan ChemiSTEM manufactured by FEI Company), and a region where Mg and oxygen (O) coexisted was identified as the magnesium oxide layer, and the thickness of the region was measured. The evaluation results are shown in Table 2.

In addition, when Cu (Cu phase) was detected in a region where Mg and O coexisted, the Cu-containing particles were determined to be "present", and the equivalent circle diameter of the Cu-containing particles was measured. The evaluation results are shown in Table 2.

(Active Metal Oxide Phase in Copper Layer)

The bonded interface between the copper sheet and the ceramic substrate was observed in a range of 3 μm×3 μm at an acceleration voltage of 200 kV and a magnification of 20,000 by using a transmission electron microscope (Titan ChemiSTEM manufactured by FEI Company), and when a region where an active metal and oxygen (O) coexisted was present in the copper layer, the active metal oxide phase was determined to be "present". The evaluation results are shown in Table 2.

The copper layer was a layer present between the magnesium oxide layer and the copper sheet. A main component of the copper layer was copper or a copper alloy, and an active metal oxide phase composed of an oxide of one or more active metals selected from Ti, Zr, Nb, and Hf was dispersed inside the copper layer.

(Evaluation of Ultrasonic Welding)

The obtained insulating circuit substrate (copper/ceramic bonded body) was subjected to a thermal cycle (−50° C.×5 minutes←→150° C.×5 minutes, 200 times).

A copper terminal (10 mm×5 mm×1 mm in thickness) was bonded to the insulating circuit substrate which had been subjected to the thermal cycle by ultrasonic welding using an ultrasonic metal bonding machine (60C-904 manufactured by Ultrasonic Engineering Co., Ltd.) under the condition where a collapse amount was 0.3 mm. Ten copper terminals were bonded at a time.

After bonding, the bonded interface between the copper sheet and the ceramic substrate was inspected by using an ultrasonic flaw detector (FineSAT200 manufactured by Hitachi Solutions, Ltd.). A case where peeling or ceramic breaking was observed in 3 pieces or more out of 10 pieces was evaluated as "C", a case where peeling or ceramic breaking was observed in 1 piece or more and 2 pieces or less out of 10 pieces was evaluated as "B", and a case where no peeling or ceramic breaking was observed in all 10 pieces was evaluated as "A". The evaluation results are shown in Table 2.

TABLE 1

|  | Mg and active metal disposing step | | | Bonding step | | | |
|---|---|---|---|---|---|---|---|
|  | Amount of Mg | Active metal | | Load | Temperature increase rate *[1] | Holding temperature | Holding time |
|  | µmol/cm$^2$ | Element | µmol/cm$^2$ | MPa | °C./min | °C. | min |
| Invention Example 1 | 28.6 | Nb | 20.7 | 0.49 | 8 | 660 | 10 |
| Invention Example 2 | 57.2 | Zr | 2.5 | 1.96 | 20 | 850 | 180 |
| Invention Example 3 | 57.2 | Ti | 10.1 | 1.47 | 8 | 750 | 30 |
| Invention Example 4 | 57.2 | Nb | 20.7 | 0.49 | 5 | 660 | 30 |
| Invention Example 5 | 28.6 | Zr | 14.8 | 0.049 | 5 | 700 | 120 |
| Invention Example 6 | 178.8 | Zr | 2.5 | 3.4 | 8 | 660 | 60 |
| Invention Example 7 | 114.4 | Ti | 0.4 | 0.98 | 25 | 800 | 60 |
| Invention Example 8 | 14.3 | Hf | 47.0 | 0.98 | 10 | 850 | 180 |
| Invention Example 9 | 14.3 | Ti | 4.8 | 0.49 | 15 | 750 | 90 |
| Comparative Example 1 | 3.6 | Ti | 4.8 | 0.49 | 15 | 750 | 90 |
| Comparative Example 2 | 28.6 | Zr | 14.8 | 0.049 | 1 | 700 | 120 |

*[1] Temperature increase rate: average temperature increase rate in temperature range of 480° C. or higher and lower than 650° C.

TABLE 2

|  | Magnesium oxide layer | | | Presence or absence of active metal oxide phase in copper layer | Evaluation of ultrasonic welding |
|---|---|---|---|---|---|
|  | Thickness nm | Cu-containing particle | | | |
|  |  | Presence or absence | Equivalent circle diameter (nm) | | |
| Invention Example 1 | 40 | Present | 15 | Present | B |
| Invention Example 2 | 1140 | Present | 12 | Present | B |
| Invention Example 3 | 420 | Present | 125 | Present | B |
| Invention Example 4 | 50 | Present | 13 | Present | A |
| Invention Example 5 | 670 | Present | 42 | Present | A |
| Invention Example 6 | 120 | Present | 86 | Present | A |
| Invention Example 7 | 520 | Present | 93 | Present | A |
| Invention Example 8 | 990 | Present | 33 | Present | A |
| Invention Example 9 | 730 | Present | 55 | Present | A |
| Comparative Example 1 | — | — | — | Absent | — |
| Comparative Example 2 | 20 | Absent | — | Absent | C |

In Comparative Example 1 in which the amount of Mg disposed at the bonded interface was small, the magnesium oxide layer was not formed at the bonded interface, and the active metal oxide phase was not present in the copper layer. In addition, since the copper sheet was peeled from the ceramic substrate after the thermal cycle was applied, the ultrasonic welding property could not be evaluated.

In Comparative Example 2 in which the temperature increase rate in the temperature range of 480° C. or higher and lower than 650° C. was set to 1° C./min, the active metal oxide phase was not present in the copper layer, and the Cu-containing particles were not present in the magnesium oxide layer. Then, the ultrasonic welding property after the thermal cycle was applied was "C".

On the other hand, in Invention Examples 1 to 9 in which the magnesium oxide layer was formed at the bonded interface and the active metal oxide phase composed of an oxide of one or more active metals selected from Ti, Zr, Nb, and Hf was dispersed inside the copper layer in contact with the magnesium oxide layer, the bonding reliability was excellent even under the thermal cycle was applied, and even in a case where ultrasonic welding was subsequently performed, peeling of the copper sheet from the ceramic substrate and generation of cracks in the ceramic substrate were small.

As a result, according to the invention examples, it was confirmed that it is possible to provide a copper/ceramic bonded body, an insulating circuit substrate, a method for producing a copper/ceramic bonded body, and a method for producing an insulating circuit substrate, which can ensure the bonding reliability between a copper member and a ceramic member even when a severe thermal cycle is applied, and can suppress peeling of the copper member from the ceramic member and generation of cracks in a ceramic substrate even when ultrasonic welding is performed.

INDUSTRIAL APPLICABILITY

It is possible to provide a copper/ceramic bonded body, an insulating circuit substrate, a method for producing a copper/ceramic bonded body, and a method for producing an insulating circuit substrate, which can ensure the bonding reliability between a copper member and a ceramic member even when a severe thermal cycle is applied, and can suppress peeling of the copper member from the ceramic member and generation of cracks in a ceramic substrate even when ultrasonic welding is performed.

EXPLANATION OF REFERENCE SIGNS

10: Insulating circuit substrate (copper/ceramic bonded body)
11: Ceramic substrate (ceramic member)
12: Circuit layer (copper member)
13: Metal layer (copper member)
41: Magnesium oxide layer
42: Cu-containing particles (Cu particles and/or compound particles of Cu and active metal)
45: Copper layer
46: Active metal oxide phase

What is claimed is:

1. A copper/ceramic bonded body comprising:
a copper member made of copper or a copper alloy; and
a ceramic member made of oxygen-containing ceramics,
wherein the copper member and the ceramic member are bonded to each other,
a magnesium oxide layer is formed on a ceramic member side between the copper member and the ceramic member, and
an active metal oxide phase composed of an oxide of one or more active metals selected from Ti, Zr, Nb, and Hf is dispersed inside a copper layer in contact with the magnesium oxide layer.

2. The copper/ceramic bonded body according to claim 1, wherein a thickness of the magnesium oxide layer is set to be in a range of 50 nm or more and 1000 nm or less.

3. The copper/ceramic bonded body according to claim 2, wherein either one or both of Cu particles and compound particles of Cu and an active metal are dispersed inside the magnesium oxide layer.

4. The copper/ceramic bonded body according to claim 2, wherein the active metal is Ti.

5. The copper/ceramic bonded body according to claim 1, wherein either one or both of Cu particles and compound particles of Cu and an active metal are dispersed inside the magnesium oxide layer.

6. A method for producing the copper/ceramic bonded body according to claim 2, the method comprising:
an active metal and Mg disposing step of disposing Mg and one or more active metals selected from Ti, Zr, Nb, and Hf between the copper member and the ceramic member;
a laminating step of laminating the copper member and the ceramic member with the active metal and Mg interposed therebetween; and
a bonding step of performing a heating treatment on the laminated copper member and ceramic member with the active metal and Mg interposed therebetween in a state of being pressed in a lamination direction under a vacuum atmosphere to bond the copper member and the ceramic member to each other,
wherein, in the active metal and Mg disposing step, an amount of the active metal is set to be in a range of 0.4 $\mu mol/cm^2$ or more and 47.0 $\mu mol/cm^2$ or less, and an amount of Mg is set to be in a range of 14 $\mu mol/cm^2$ or more and 180 $\mu mol/cm^2$ or less, and
in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

7. The copper/ceramic bonded body according to claim 5, wherein either one or both of Cu particles and compound particles of Cu and an active metal are dispersed inside the magnesium oxide layer.

8. The copper/ceramic bonded body according to claim 5, wherein an equivalent circle diameter of the Cu particles and the compound particles dispersed inside the magnesium oxide layer is set to be in a range of 10 nm or more and 100 nm or less.

9. A method for producing the copper/ceramic bonded body according to claim 5, the method comprising:
an active metal and Mg disposing step of disposing Mg and one or more active metals selected from Ti, Zr, Nb, and Hf between the copper member and the ceramic member;
a laminating step of laminating the copper member and the ceramic member with the active metal and Mg interposed therebetween; and
a bonding step of performing a heating treatment on the laminated copper member and ceramic member with the active metal and Mg interposed therebetween in a state of being pressed in a lamination direction under a vacuum atmosphere to bond the copper member and the ceramic member to each other, wherein, in the active metal and Mg disposing step, an amount of the active metal is set to be in a range of 0.4 µmol/cm² or more and 47.0 µmol/cm² or less, and an amount of Mg is set to be in a range of 14 µmol/cm² or more and 180 µmol/cm² or less, and in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

10. The copper/ceramic bonded body according to claim 1,
wherein the active metal is Ti.

11. A method for producing the copper/ceramic bonded body according to claim 1, the method comprising:
an active metal and Mg disposing step of disposing Mg and one or more active metals selected from Ti, Zr, Nb, and Hf between the copper member and the ceramic member;
a laminating step of laminating the copper member and the ceramic member with the active metal and Mg interposed therebetween; and
a bonding step of performing a heating treatment on the laminated copper member and ceramic member with the active metal and Mg interposed therebetween in a state of being pressed in a lamination direction under a vacuum atmosphere to bond the copper member and the ceramic member to each other,
wherein, in the active metal and Mg disposing step, an amount of the active metal is set to be in a range of 0.4 µmol/cm² or more and 47.0 µmol/cm² or less, and an amount of Mg is set to be in a range of 14 µmol/cm² or more and 180 µmol/cm² or less, and
in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

12. An insulating circuit substrate comprising:
a copper sheet made of copper or a copper alloy; and
a ceramic substrate made of oxygen-containing ceramics,
wherein the copper sheet is bonded to a surface of the ceramic substrate,
a magnesium oxide layer is formed on a ceramic substrate side between the ceramic substrate and the copper sheet, and
an active metal oxide phase composed of an oxide of one or more active metals selected from Ti, Zr, Nb, and Hf is dispersed inside a copper layer in contact with the magnesium oxide layer.

13. The insulating circuit substrate according to claim 12, wherein a thickness of the magnesium oxide layer is set to be in a range of 50 nm or more and 1000 nm or less.

14. The insulating circuit substrate according to claim 13, wherein either one or both of Cu particles and compound particles of Cu and an active metal are dispersed inside the magnesium oxide layer.

15. The insulating circuit substrate according to claim 13, wherein the active metal is Ti.

16. A method for producing the insulating circuit substrate according to claim 13, the method comprising:
an active metal and Mg disposing step of disposing Mg and one or more active metals selected from Ti, Zr, Nb, and Hf between the copper sheet and the ceramic substrate;
a laminating step of laminating the copper sheet and the ceramic substrate with the active metal and Mg interposed therebetween; and
a bonding step of performing a heating treatment on the laminated copper sheet and ceramic substrate with the active metal and Mg interposed therebetween in a state of being pressed in a lamination direction under a vacuum atmosphere to bond the copper sheet and the ceramic substrate to each other,
wherein, in the active metal and Mg disposing step, an amount of the active metal is set to be in a range of 0.4 µmol/cm² or more and 47.0 µmol/cm² or less, and an amount of Mg is set to be in a range of 14 µmol/cm² or more and 180 µmol/cm² or less, and
in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

17. The insulating circuit substrate according to claim 12, wherein either one or both of Cu particles and compound particles of Cu and an active metal are dispersed inside the magnesium oxide layer.

18. The insulating circuit substrate according to claim 17, wherein an equivalent circle diameter of the Cu particles and the compound particles dispersed inside the magnesium oxide layer is set to be in a range of 10 nm or more and 100 nm or less.

19. The insulating circuit substrate according to claim 12, wherein the active metal is Ti.

20. A method for producing the insulating circuit substrate according to claim 12, the method comprising:
an active metal and Mg disposing step of disposing Mg and one or more active metals selected from Ti, Zr, Nb, and Hf between the copper sheet and the ceramic substrate;
a laminating step of laminating the copper sheet and the ceramic substrate with the active metal and Mg interposed therebetween; and
a bonding step of performing a heating treatment on the laminated copper sheet and ceramic substrate with the active metal and Mg interposed therebetween in a state of being pressed in a lamination direction under a vacuum atmosphere to bond the copper sheet and the ceramic substrate to each other,
wherein, in the active metal and Mg disposing step, an amount of the active metal is set to be in a range of 0.4 µmol/cm² or more and 47.0 µmol/cm² or less, and an amount of Mg is set to be in a range of 14 µmol/cm² or more and 180 µmol/cm² or less, and
in the bonding step, a temperature increase rate in a temperature range of 480° C. or higher and lower than 650° C. is set to be 5° C./min or higher, a holding temperature is set to be in a range of 650° C. or higher and 850° C. or lower, and a holding time at the holding temperature is set to be in a range of 10 minutes or longer and 180 minutes or shorter.

* * * * *